(12) United States Patent
Hein et al.

(10) Patent No.: US 7,594,970 B2
(45) Date of Patent: Sep. 29, 2009

(54) WEB COATING APPARATUS WITH A VACUUM CHAMBER AND A COATING CYLINDER

(75) Inventors: Stefan Hein, Blankenbach (DE); Peter Skuk, Nidderau (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 132 days.

(21) Appl. No.: 10/784,477

(22) Filed: Feb. 23, 2004

(65) Prior Publication Data

US 2005/0172898 A1    Aug. 11, 2005

(30) Foreign Application Priority Data

Feb. 7, 2004   (DE) ........................ 10 2004 006 131

(51) Int. Cl.
    *C23C 16/00*      (2006.01)
(52) U.S. Cl. .................... 118/718; 118/719; 204/298.24
(58) Field of Classification Search ................. 118/718; 204/298.24; 427/255.5
    See application file for complete search history.

(56) References Cited

U.S. PATENT DOCUMENTS

| | | | |
|---|---|---|---|
| 2,925,062 A * | 2/1960 | Schwindt | ..................... 118/718 |
| 4,692,233 A | 9/1987 | Casey | |
| 6,171,458 B1 | 1/2001 | Hultmark | |
| 6,630,058 B2 * | 10/2003 | Muraoka | ............... 204/192.12 |

FOREIGN PATENT DOCUMENTS

| | | |
|---|---|---|
| DE | 42 07 526 C2 | 9/1993 |
| DE | 42 23 568 C1 | 11/1993 |
| DE | 43 08 633 C2 | 9/1994 |
| DE | 10 157 186 C1 | 1/2003 |
| DE | 101 57 186 C1 | 1/2003 |
| WO | WO-98/11271 A | 3/1998 |
| WO | WO-99/50472 | 10/1999 |
| WO | WO-03/046251 A1 | 6/2003 |

* cited by examiner

*Primary Examiner*—Karla Moore
(74) *Attorney, Agent, or Firm*—Fulbright & Jaworski L.L.P.

(57) ABSTRACT

A web coating apparatus with a vacuum chamber (1) has between a rear wall (18) and at least one removable closing plate (22), housing member (20) with a planar cover (10), and at least one guide roll (12, 13, 14, 15) and a coating cylinder (9) with an axle (A) and at least one coating source (39a, 39b, 39c) are arranged in the vacuum chamber (1). To reduce structural height and width and to achieve an easily viewable and controllable web path while avoiding particle formation in the reach of the coating cylinder (9), provision is made pursuant to the invention that the ends of the at least one guide roll (12, 13, 14, 15) and of the coating cylinder are affixed by supporting elements (16, 17 and 19) with bearings to the cover (10) and that the cavity in the vacuum chamber (1) under the coating cylinder (9) is kept free of supporting elements. At the same time it is possible to mount the at least one guide roll (12, 13, 14, 15) and the coating cylinder (9) with their ends remote from the closing plate (22) on the rear wall (18), or, alternatively, to journal the at least one guide roll (12, 13, 14, 15) and the coating cylinder (9) on supporting elements in front of the rear wall (18) and hold it onto the cover (10).

20 Claims, 4 Drawing Sheets

WEB COATING APPARATUS WITH A VACUUM CHAMBER AND A COATING CYLINDER

Figure 1:
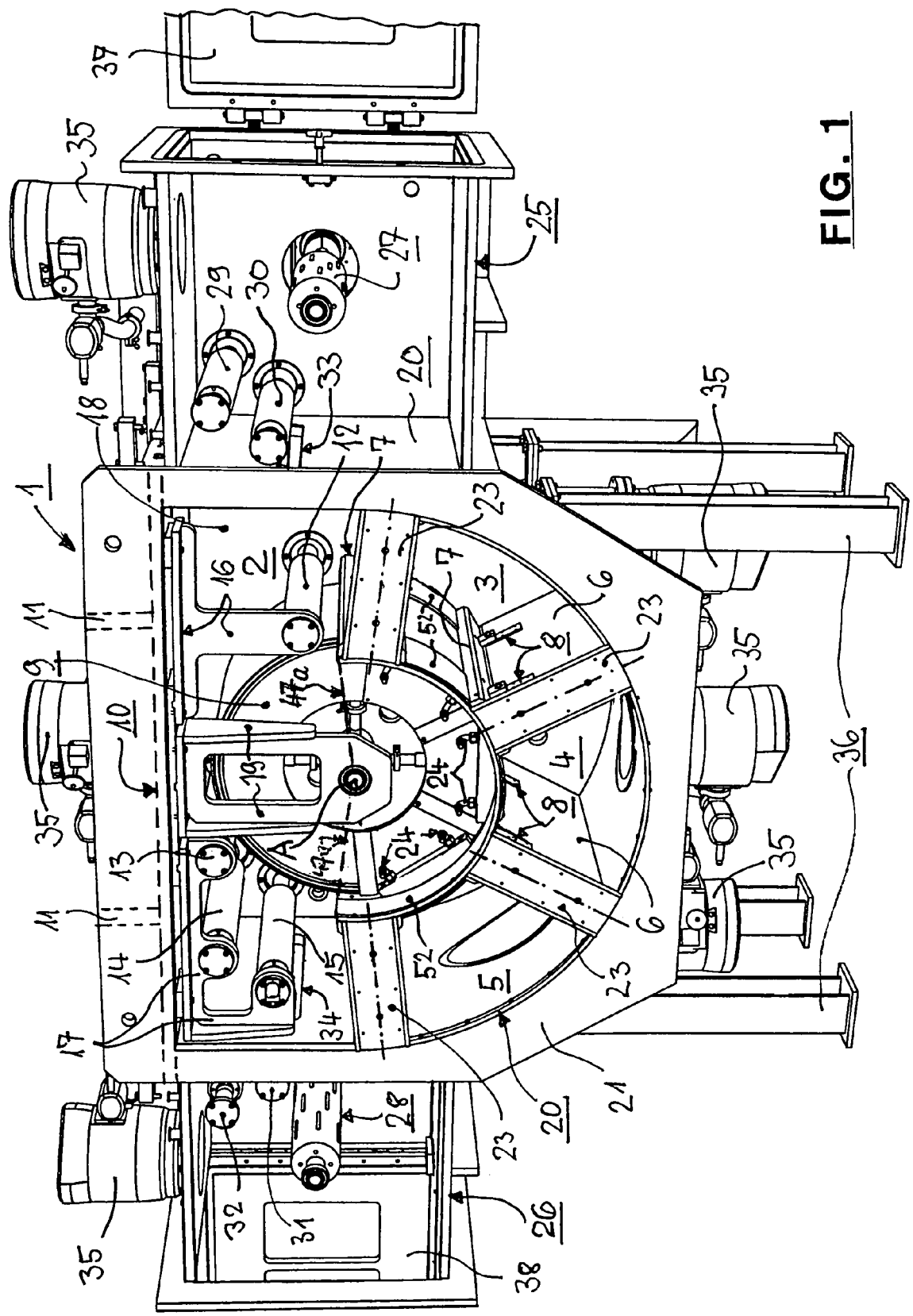

This application claims priority from German 10 2004 006 131.9 filed Feb. 7, 2004. hereby incorporated by reference in its entirety.

The invention relates to a web coating apparatus with a vacuum chamber, which has at least one removable closing plate, housing member with a planar cover, at least one guide roll and one coating cylinder with an axle as well as at least one coating source being arranged in the vacuum chamber.

The webs and substrates are films of metals and plastics, paper and/or composite materials. The coating sources are, for example, evaporators, sputtering cathodes with and without magnetic field amplification, gas sources etc., wherein by the addition of gases metallic and/or oxidic coatings and layer stacks can be produced from a plurality of coatings. Conventional methods are the PVD process (physical vapor deposition), and PCVD processes (physical-chemical vapor depositing). Also preliminary treatment of the webs and aftertreatment of the coatings are possible through known reactions. Examples of products are dealt with in the description, but are not exhaustively described.

A web coating apparatus is disclosed in U.S. Pat. No. 4,692,233A, in which chassis with closure walls are arranged on two sides of a cylindrical housing member. The one chassis bears a cantilevered winding system with a central coating cylinder, winding and unwinding rolls for the web coated or to be coated as well as a plurality of guide rolls for wrinkle-free web guidance. The other chassis likewise bears a cantilevered coating system with three coating sources. Beneath a horizontal central plane, in which the axle of the coating cylinder lies, there are three sector-shaped sub-chambers. Thus four sub-chambers are formed, each of which is connected to its own vacuum pump. When the apparatus is assembled, the winding system is introduced from one side, and the coating system from the opposite side.

For such types of apparatus the following is basic: By means of appropriate guides, e.g., rails, care must be taken to see that the parts not only do not touch one another, but also assume precisely assigned positions. At the same time the dividing walls between the sub-chambers constitute a problem: on the one hand they are to provide good sealing of the sub-chambers from one another, but on the other hand they must not touch the web. In the case of the subject matter of U.S. Pat. No. 4,692,233A, the problem was dealt with such that the dividing walls were made in three pieces from the inside out, the inner parts are fastened to the wheeled winding frame, the outer parts are welded to the chassis of the vacuum chamber, and elastomeric sliding seals are arranged between them. But the seal against the ends of the coating cylinder is extremely imperfect. At the same time the space occupied on both sides of the vacuum chamber is immense on account of the traveling movements of the internal parts. But also the structural height is exceedingly great because the unwinding and take-up rolls are above the coating cylinder. The usual heights of such apparatus are between about 3.5 and 4 meters. Furthermore, any debris particles produced by the many moving parts in the upper chamber are a primary threat to coating quality.

DE 42 07 525 C2 discloses, in the case of a similar apparatus, a configuration wherein the coating system is stationary in a vacuum chamber and the winding system is made retractable, suspended at one end on a roof rail of the vacuum chamber and at the other end supported on a rail vehicle. A roof rail in a vacuum chamber is, again, a cause of undesired attrition and the problem of structural height is about the same.

In the article by Langlois et al. "Engineering Solutions Enabling a New Family of Expandable Multi-Process, Multi-Chamber Vacuum Roll Coaters, published in 1999 by the Society of Vacuum Coaters, ISSN 0737-5921, pages 475 to 479, the opposite solution is disclosed of leaving the winding system always in a stationary vacuum chamber and make the coating systems retractable for maintenance and cleaning purposes. To avoid cantilevered supports of the rolls of the winding system, the bearings at one end are mounted in a supporting body, which is in the shape of a "Y" with a strong circular bulge in the area of the coating cylinder. This supporting body is bolted at its bottom end with a mounting bracket to the bottom of the vacuum chamber and thus blocks a very important location for installing a central coating source. The case is similar with an opposite support, of which only the right-hand bolting foot is visible. In the overall view with the track for a crane bridge, the result is here too that the entire structural height would probably easily exceed 3.5 to 4 meters.

DE 101 57 186 C1 discloses a web coating apparatus with a central chamber in which there is a processing roller stand with two coating cylinders. It rests on crossbeams at two inner walls which, however, can transfer the load only downward to the floor, because even these inner walls have near their upper ends pass-through gaps called web valves for the web material. These pass-through gaps take up nearly the entire width of the apparatus, so that the cover is not involved as a support of the processing roller stand. About its ability to move and the overall structural height this patent says nothing.

The invention, therefore, is addressed to the problem of designing a web coating apparatus of the kind described above having a plurality of chambers and being of the lowest possible structural height and having also a minimal width for a given web width, in which the course of the web in the open state, i.e., is easily viewed and controlled with the coating sources deployed, in which a minimum number of moving parts causing particles is above the coating cylinder, which can easily be transported, and which can be used even in clean rooms of limited dimensions. Lastly, an effective sealing of the individual chambers from one another is to be achieved, while secondary paths for such flows over the front sides of the coating cylinder are to be excluded insofar as possible.

Absence of particles is essential, especially for the following applications:
  a) Copper surfaces for FPCB's ("flexible printed circuit boards"): The width of the conductor paths which are etched away after the coating becomes ever narrower as integration density increases. Thus, even a single grain of dust can interrupt a conductor path.
  b) Flexible IC's: Meantime there are methods for producing printed circuits on films. This serves, for example, for the arrangement of image screen drivers directly on the film, alongside the flexible film display. In this case the space occupied by the components, e.g., transistors, is even smaller, and the requirements regarding absence of particles in the manufacturing process becomes even more stringent.
  c) Antireflective coatings for displays (AR, ARAS): On an antireflective display, a grain of dust during the coating produces a masked and thus not antireflectivized area in an extremely undesirable manner, e.g., as a small, bright spot on an otherwise dark image screen area.

The solution of the stated problem is accomplished according to the invention in the web coating apparatus described in the beginning by the fact that the ends of the at least one guide roll and coating cylinder pointing toward the closing plate are fastened through supporting elements with bearings onto the cover, and that the space in the vacuum chamber underneath the coating cylinder is kept free of supporting elements.

Thus, the stated problem is solved entirely. Especially in the case of a given web width and length a very low structural height and also a very small structural width are accomplished. The course of the web in the open state, i.e., with the coating sources deployed, is easily viewed and controlled. Above the coating cylinder there is a very small number of moving parts that cause particles. The apparatus can be transported easily and also can be used in clean rooms of small dimensions. Finally, an effective sealing off of the individual chambers from one another is achieved, while secondary paths of flows over the ends of the coating cylinder are excluded to the greatest possible extent.

As a result of additional configurations of the invention it is especially advantageous if—either individually or in combination:

The at least one guide roll and the coating cylinder are mounted by their ends remote from the closing plate on the back wall.

The at least one guide roll and the coating cylinder are mounted on supporting means at their ends remote from the closing plate and held on the cover.

The space beneath and laterally of the coating cylinder is divided by partitions into at least two chambers, and if the partition walls have sealing means on their ends facing the coating cylinder, their curvature is adapted to the radius of the coating cylinder such that arcuate gasket grooves are formed.

The sealing elements are connected each by adjusting mechanisms to their corresponding dividing walls such that the gasket grooves are adjustable radially to the smallest possible values.

At least four sub-chambers are formed by dividing walls inside of the vacuum chamber on the circumference of the coating cylinder.

The two uppermost dividing walls form between them an angle between 120 and 180 degrees extending downward with respect to the shaft.

The partial circumference of the housing member lying beneath the two uppermost dividing walls are of partially cylindrical shape.

In the sub-chamber lying above the two uppermost dividing walls a total of four guide rolls are arranged.

The dividing walls have at their ends facing away from the back wall radially disposed sealing bars, and the closing plate can be brought into contact with them.

The sealing bars have elastomeric sealing edges running parallel to their radial center lines, and the closing plate can be brought into contact with them when the vacuum chamber is closed.

The coating cylinder has a front face facing the closing plate, and in front of it a fixed ring sector is disposed which clutches part of the circumference of the bottom end of the supporting element for the coating cylinder.

The coating cylinder is surrounded coaxially at its ends within the sub-chambers by strip-like arcuate masks, which wrap around the said ends with narrow clearance and shield the coating cylinder against coating of its surface portions which are not shielded by the web.

The front mask has an elastomeric sealing edge against which the closing plate can be brought into contact when the vacuum chamber is closed.

The ring sector extends on the circumference up to its terminal edges within the front mask.

The total height of the apparatus, measured from the base surface, is no more than 2.5 meters.

The vacuum chamber has two side chambers, one on each side of the coating roll, one containing a winding mandrel for a supply roll and the other a take-up roll, as well as guide rollers for the band.

The side chambers are configured as vacuum chambers and are connected to the partial chamber of the vacuum chamber through slot-like gaps for the band to pass through them.

All partial chambers of the vacuum chamber and the side chambers are connected each to its own vacuum pump, and/or whenever the upper sides of the side chambers lie at least substantially at the same level as the cover of the vacuum chamber.

Embodiments of the subject of the invention and their operation are explained below with the aid of FIG. 1 to 5.

FIG. 1 A perspective view of an open vacuum apparatus having a coating chamber and two lock chambers after the coating system has been moved out by removing a sealing wall, but it does not show the path of the band.

Figure 2:
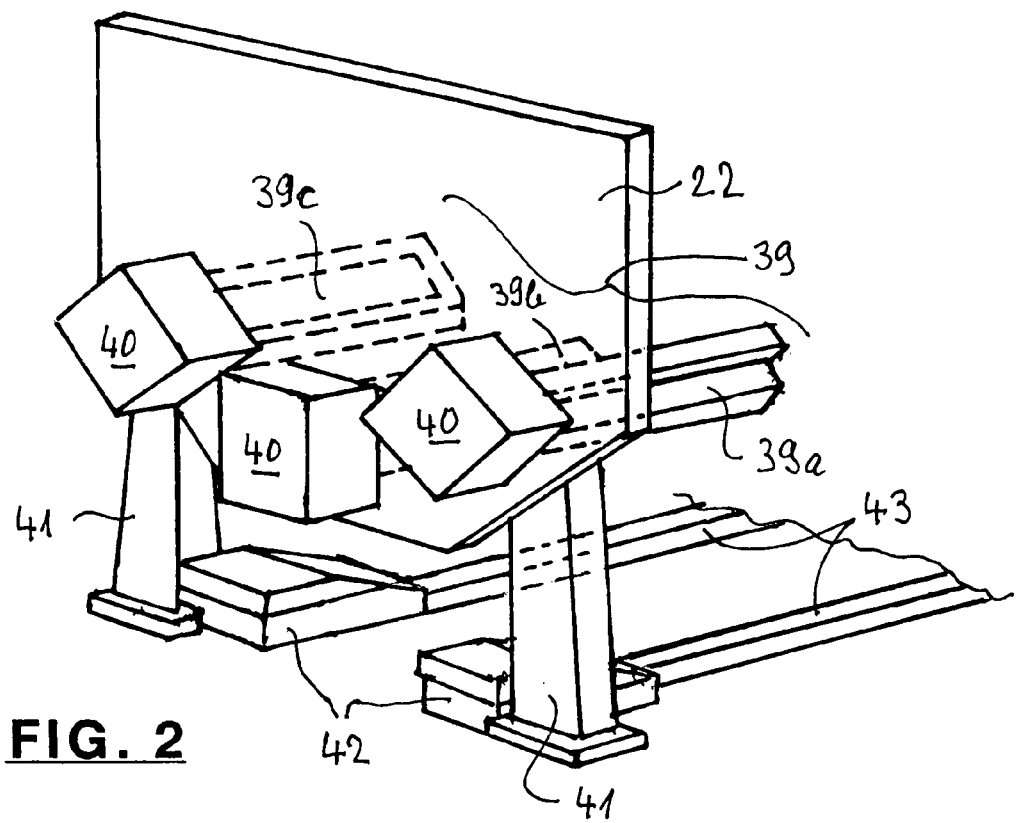

FIG. 2 A highly schematic perspective representation of a sealing wall with an installed coating system consisting of three coating sources, seen from a slightly higher viewpoint.

Figure 3:
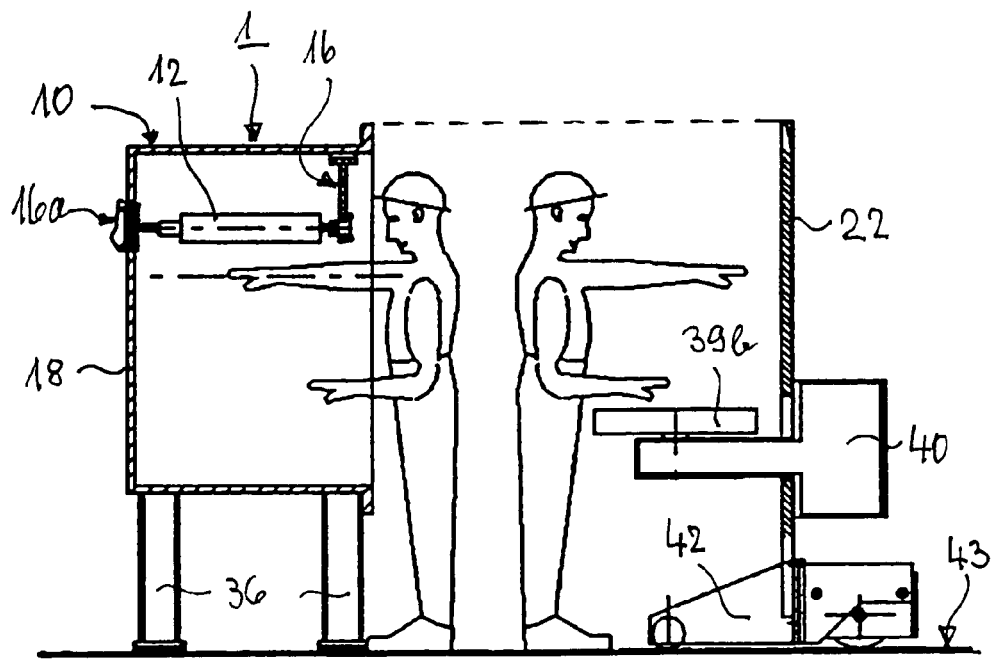

FIG. 3 Partial vertical sections through a separated apparatus according to FIGS. 1 and 2 with two persons to operate it.

Figure 4:
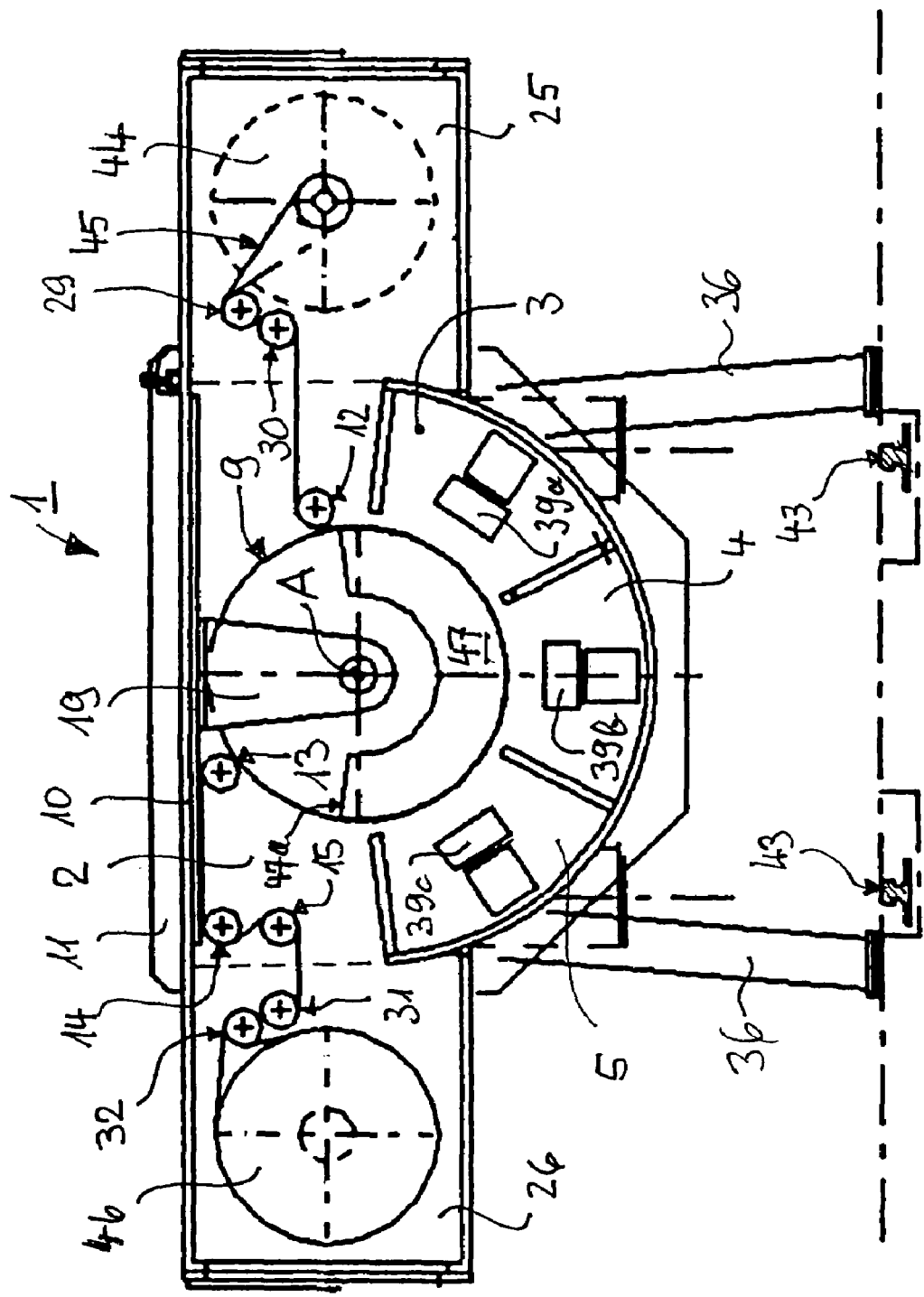
Figure 5:
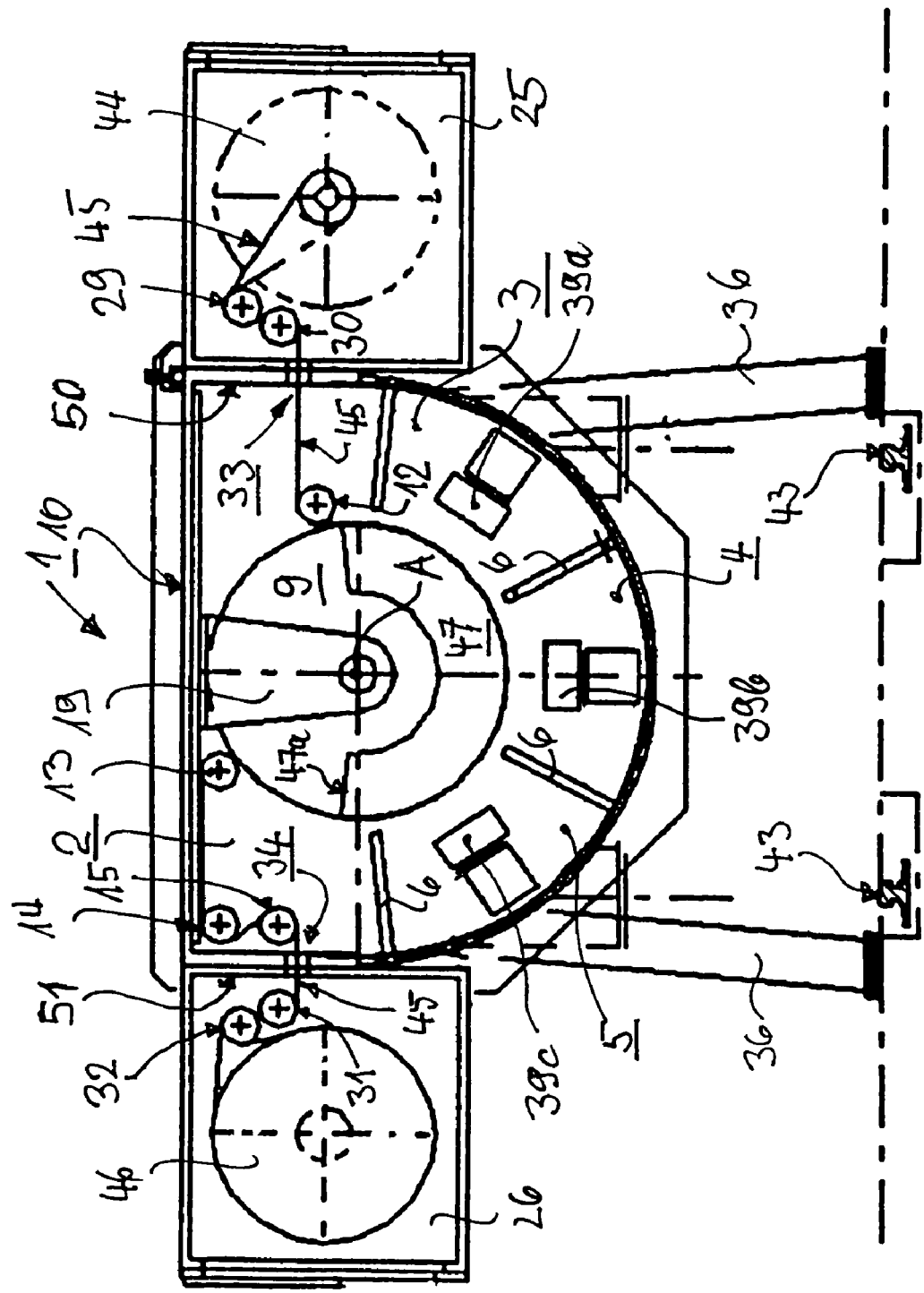

FIG. 4 A highly simplified front elevation of an open vacuum apparatus with a coating chamber and two side chambers to accommodate feed rolls and take-up rolls for the bands, but without a sealing wall, but showing the course of the band, and FIG. 5 A front elevation similar to FIG. 4, but with the difference that the side chambers opposite the coating chamber are configured as lock chambers.

In FIG. 1 there is shown a vacuum chamber 1 which represents a coating chamber and is divided into four sub-chambers 2, 3, 4 and 5. The sub-chambers 2, 3, 4 and 5 are closed with the exception of narrow, arcuate gaps, by partition walls 6 only two of which are visible here. The radial shape in the direction of a shaft A corresponds to the dash-dotted lines. The radially interior ends of the dividing walls are provided with arcuate sealing elements 7, which are adjustable by means of actuating mechanisms 8 to form a very narrow gap between them and a coating cylinder 9.

The uppermost sub-chamber 2 has a flat cover 10 which is additionally strengthened by cross beams 11. In this sub-chamber 2, except for approximately the upper half of the coating cylinder 9 there are four guide rolls 12, 13, 14 and 15, which together with the coating cylinder 9 determine the path of movement of the web, as is shown in greater detail in FIGS. 4 and 5. The front ends of the guide rolls 12, 13, 14 and 15 are journaled in strong hangers 16 and 17, which are affixed, bolted for example, to the cover 10. The back ends of the guide rolls 12, 13, 14 and 15 are journaled by appropriate bearings directly in a back wall 18 which closes the back of the vacuum chamber 1. This mounting is visible only as regards the guide the guide rolls 12 and 15. The mounting can be made releasable, yet the back wall does not have to be removed to change the web and for maintenance and inspection.

Similarly, the front end of the shaft A of the coating cylinder 9 is mounted in a stable support 19 which is likewise affixed to the cover 10, for example by bolting. The rear bearing of the coating cylinder 9, not visible here, is again journaled in the back wall 18. The result is an extremely stable mounting and precise web guidance, also in the narrow gaps of the sealing elements 7. Mainly, however, the lower portion of the coating cylinder 9—aside from the necessary dividing walls 6 and their sealing means—is kept completely free from bulky supporting means.

The vacuum chamber 1 is surrounded by housing member 20 which also includes the cover 10. A sealing flange 21 is welded onto this housing member on the front side parallel to the back wall 18 and its polygonal circumference corresponds to that of the closing plate 22 (see FIG. 2). Roughly speaking, the bottom half of the housing member 20 is cylindrical and concentric with the axis A. Thus the sub-chambers 3, 4 and 5 with their dividing walls 6 have a sector shape and have a very small volume and the greatest possible strength (with respect to the given web width).

In order to further improve the sealing of the sub-chambers 2, 3, 4 and 5 from one another, sealing bars 23 are placed on the dividing walls 6 and come into contact with elastomeric sealing edges, not shown, come into contact with the closing plate 20 when the vacuum chamber 1 is being closed. In order to minimize so-called short-circuits across the front end of the coating cylinder 9, which is visible here, another ring sector 47 of a matching circumference angle, shown in FIGS. 4 and 5, can be placed in front of this end. Here only the two upper edges 47a of sector 47 are shown in broken lines.

To fasten the sector 47, a plurality of brackets 24 are provided whose axially parallel upstanding ends are threaded. The correspondingly bored sector 47 can thus be held between the ends of the sealing bars 23 and the support 19. If this sector is provided with cooling channels the brackets 24 can be designed as coolant conduits and be connected to corresponding conduits not shown. To protect the front edges of the coating cylinder 9 from becoming coated, these edges are protected front and back by masks 52 which extend between the end edges 47a over slightly more than 180 degrees of the circumference. Within the front mask 52 the said ring sector 47 is positioned. The closing plate 22 (FIG. 2) then also contacts the front mask 52 and a sealing edge there present, so that then short-circuits between the gas atmospheres of the sub-chambers 3, 4 and 5 are prevented or reduced at this point.

In the upper part of vacuum chamber 1, two side chambers 25 and 26 are attached to the housing member 20 at its planar portions, and they are configured as lock chambers. The front closing walls have been omitted for clarity. These side chambers 25 and 26, whose flat covers are at approximately the same height as the cover 10, are provided with central winding mandrels 27 and 28 which are journaled at both ends for the winding and unwinding rolls, not shown here, with the webs, as well as with additional guide rollers 29, 30, 31 and 32 for these webs. The web movement to and from the vacuum chamber 1 passes through narrow slits 33 and 34. The web passageway is shown in FIGS. 4 and 5. All of the sub-chambers 2, 3, 4 and 5 of the vacuum chamber 1 as well as the side chambers 25 and 26 are provided with their own vacuum pumps 35 so that a specific atmosphere can be established in each sub-chamber for the coating. The entire system rests on a frame 36 of four legs. Doors 37 and 38 serve for the loading and removal of winding and unwinding rolls. At least a part of the guide rolls can be made in the form of known spreader rolls in order to prevent wrinkling of the moving webs.

In FIG. 2 is a greatly schematized perspective drawing, from a slightly higher viewing angle than in FIG. 1, of a closing wall 22 with a coating system 39 built thereon, consisting of three coating sources 39a, 39b and 39c. These coating sources extend from mountings which are contained in three connecting boxes 40 for a required gas and/or power supply. The closing wall is borne by two columns 41 which are fastened to chassis 42 which can travel along rails 43 embedded in the floor. The coating sources and the rails run perpendicular to the closing wall, and do so in such an alignment in space that the coating sources 39a, 39b and 39c can be introduced exactly and axially parallel into the sub-chambers 3, 4 and 5 of vacuum chamber 1 in a position as represented in FIGS. 4 and 5.

In the figures that follow, the same reference numbers are used for the parts thus far described, insofar as is necessary.

FIG. 3 shows partially vertical sections through separated apparatus according to FIGS. 1 and 2 with two persons operating them. On the left is shown the vacuum chamber 1, but without any other parts of the installation, except for the first guide roll 12 and its inner bearings. It can be seen that the guide roll 12 is held on the opening side by the supporting elements 16 on the cover 10, and is journaled in the back wall 18 by means of a bearing 16a. Beside it on the right there is only shown the closing plate 22 with the central coating source 39b and one of the chassis 42. It can be seen that the total height is scarcely bigger than an adult person, so that such a design is especially good for positioning in clean rooms. But if there are no space limitations, larger structures are entirely feasible.

FIG. 4 represents a greatly simplified front elevation of an open vacuum apparatus 1 with a coating chamber and two side chambers 25 and 26 with a continuous cover 10 and showing the course of the web as follows: The web 45 is brought from a supply roll 44, whose initial diameter is represented by a broken line, over the guide rolls 29, 30 and 12, to the coating cylinder 9, and is driven by the latter through the coating sources 39a, 39b and 39c to the guide roll 13, and passes from there to the guide rolls 14, 15, 31 and 32, and is finally taken up by the winding roll 46. Indicated here is the sector 47, described in connection with FIG. 1, facing the front end of the coating cylinder 9 and partially encompassing the axis A and the lower end of the supporting element 19.

In the similarly represented embodiment in FIG. 5, the side chambers 25 and 26 are configured as in FIG. 1, with the same course of web movement, as airlock chambers, namely by the arrangement of dividing walls 50 and 51 in which the slots 33 and 34 for the passage of the web 45 are arranged as in FIG. 1.

The invention claimed is:

1. A strip coating installation having a vacuum chamber which has, between a rear wall and at least one removable closing plate, a casing with a flat top, wherein at least one guide roller, a coating roller with an axis (A), and at least one coating source are positioned inside the vacuum chamber; wherein
   ends of the at least one guide roller and of the coating roller that face toward the removable closing plate are attached by supporting elements and bearings directly to the top, and wherein a space in the vacuum chamber beneath the coating roller is free of the supporting elements.

2. A strip coating installation as in claim 1, wherein the at least one guide roller and the coating roller are mounted at ends that face away from the closing plate on bearings on the rear wall.

3. A strip coating installation as in claim 1, wherein the at least one guide roller and the coating roller are, at the ends that face away from the closing plate, mounted on bearings on the supporting elements in front of the rear wall and held on the top.

4. A strip coating installation as in claim 1, wherein the space beneath the coating roller and at a side of the coating roller is divided by partitions into at least two chamber sections, and wherein the partitions have sealing elements at ends that face towards the coating roller, wherein a curvature of the sealing elements is configured to fit the radius of the coating roller in such a manner that curved sealing gaps are formed between the sealing elements and the coating roller.

5. A strip coating installation as in claim 4, wherein each of the sealing elements is connected to an accompanying partition by an adjustment mechanism such that the sealing gaps can be adjusted to a smallest possible size in a radial direction.

6. A strip coating installation as in claim 1, wherein, inside the vacuum chamber at least four chamber sections are formed on a circumference of the coating roller with partitions.

7. A strip coating installation as in claim 1, wherein the installation further comprises two uppermost partitions which enclose an angle of between 120 and 180 degrees downwards in relation to the axis (A).

8. A strip coating installation as in claim 7, wherein a circumferential section of the casing that is beneath the two uppermost partitions is in the shape of a part-cylinder.

9. A strip coating installation as in claim 8, wherein a total of four guide rollers are positioned in the vacuum chamber above the two uppermost partitions.

10. A strip coating installation as in claim 1, wherein the installation further comprises partitions having, at ends that face away from the rear wall, radial sealing strips against which the closing plate can be brought to rest.

11. A strip coating installation as in claim 10, wherein the sealing strips have elastomeric sealing edges that run parallel to radial center lines thereof, against which edges the closing plate can be brought to rest when vacuum chamber is closed.

12. A strip coating installation as in claim 11, wherein the coating roller has an end face that faces towards the closing plate, in front of which end face is positioned a fixed ring sector which encloses the lower end of the supporting elements for the coating roller around part of a circumference thereof.

13. A strip coating installation as in claim 1, the installation further comprising chamber sections, wherein the coating roller is surrounded at the end that faces towards the closing plate and an end that faces away from the closing plate, inside the chamber sections by strip-shaped screens that are curved cylindrically and coaxially, which screens enclose said ends with narrow gaps and shield the coating roller from being coated on surfaces thereof that are not covered by the strip.

14. A strip coating installation as in claim 13, wherein at least one of the screens is a front screen having an elastomeric sealing edge against which the closing plate can be brought to rest when the vacuum chamber is closed.

15. A strip coating installation as in claim 14, wherein the installation further has a ring sector which extends over the circumference of the coating roller as far as its end edge that faces toward the closing plate inside the front screen.

16. A strip coating installation as in claim 1, wherein an overall height of the installation, measured from the surface on which it is mounted, is a maximum of 2.5 meters.

17. A strip coating installation as in claim 1, wherein the vacuum chamber has, on each of two sides of the coating roller, a side chamber, wherein in each of the side chambers are positioned a winding spindle for an off-winding roller and a take-up roller respectively, and accompanying guide rollers for a strip.

18. A strip coating installation as in claim 17, wherein the side chambers are in the form of vacuum chambers and are linked to a chamber section of the vacuum chamber by means of slot-shaped gaps for the strip to pass through.

19. A strip coating installation as in claim 17, wherein top surfaces of the side chambers are at least substantially positioned at a same height as a top of the vacuum chamber.

20. A strip coating installation as in claim 1, wherein the installation further has side chambers and the vacuum chamber has chamber sections, wherein each of the chamber sections of the vacuum chamber and side chambers is connected to a vacuum pump of its own.

* * * * *

UNITED STATES PATENT AND TRADEMARK OFFICE
CERTIFICATE OF CORRECTION

PATENT NO. : 7,594,970 B2 Page 1 of 1
APPLICATION NO. : 10/784477
DATED : September 29, 2009
INVENTOR(S) : Hein et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 186 days.

Signed and Sealed this

Twenty-eighth Day of September, 2010

David J. Kappos
*Director of the United States Patent and Trademark Office*